(12) United States Patent
Yim et al.

(10) Patent No.: US 10,707,876 B1
(45) Date of Patent: Jul. 7, 2020

(54) HIGH-VOLTAGE AND LOW-VOLTAGE SIGNALING OUTPUT DRIVER

(71) Applicant: QUALCOMM Incorporated, San Diego, CA (US)

(72) Inventors: Young Uk Yim, San Diego, CA (US); Jacob Schneider, San Diego, CA (US); Satish Krishnamoorthy, San Diego, CA (US); Mohammed Mizanur Rahman, San Diego, CA (US); Prince Mathew, San Diego, CA (US); Andrew Tohme, San Mateo, CA (US); Chang Ki Kwon, San Diego, CA (US); Ashwin Sethuram, San Clemente, CA (US); Mostafa Naguib Abdulla, Rancho Cordova, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/743,915

(22) Filed: Jan. 15, 2020

Related U.S. Application Data (60) Provisional application No. 62/794,308, filed on Jan. 18, 2019.

(51) Int. Cl.
| | | |
|---|---|---|
| *H03K 19/17736* | (2020.01) | |
| *H02M 3/158* | (2006.01) | |
| *H03K 19/173* | (2006.01) | |
| *H03K 19/0185* | (2006.01) | |

(52) U.S. Cl.
CPC ...... *H03K 19/17744* (2013.01); *H02M 3/158* (2013.01); *H03K 19/0185* (2013.01); *H03K 19/1733* (2013.01)

(58) Field of Classification Search
None
See application file for complete search history.

(56) References Cited

U.S. PATENT DOCUMENTS

| | | | | |
|---|---|---|---|---|
| 9,383,794 | B2 * | 7/2016 | Aggarwal | G06F 1/26 |
| 10,347,325 | B1 * | 7/2019 | Chou | G11C 7/1057 |
| 2001/0043094 | A1 * | 11/2001 | Clark | H03K 19/018585 |
| | | | | 327/112 |
| 2005/0184768 | A1 * | 8/2005 | Pilling | H03K 19/00315 |
| | | | | 327/112 |
| 2014/0152340 | A1 * | 6/2014 | Cho | H03K 19/0005 |
| | | | | 326/30 |
| 2014/0313846 | A1 | 10/2014 | Koo | |
| 2019/0305778 | A1 * | 10/2019 | Chen | H03K 17/6872 |

FOREIGN PATENT DOCUMENTS

WO 2001018967 3/2001

\* cited by examiner

*Primary Examiner* — Seokjin Kim
(74) *Attorney, Agent, or Firm* — Haynes and Boone, LLP (57) ABSTRACT

A hybrid output driver is disclosed that supports high-voltage signaling and low-voltage signaling. The high-voltage signaling is powered by a high-power supply voltage that is greater than a low-power supply voltage that powers the low-voltage signaling.

22 Claims, 6 Drawing Sheets

HIGH-VOLTAGE AND LOW-VOLTAGE SIGNALING OUTPUT DRIVER

CROSS REFERENCE TO RELATED APPLICATIONS

This application claims the benefit of U.S. Provisional Application No. 62/794,308, filed Jan. 18, 2019, which is incorporated by reference herein.

TECHNICAL FIELD

This application relates to output drivers, and more particularly to a hybrid output driver for high-voltage and low-voltage signaling.

BACKGROUND

Input/output standards have varying power supply voltages depending upon the application. For example, various power supply voltages are used in the low-power double-data-rate (LPDDR) standards for the interface between mobile computers (e.g., smartphones and tablets) and synchronous dynamic random access memories. In the LPDDR3 standard, the nominal power supply voltage is 1.2V whereas it is 0.6 V for the LPDDR4X standard. In general, the power supply voltage is lowered for more modern standards to save power. There are thus I/O standards with relatively-low power supply voltages and those with relatively-high power supply voltages. A given output driver for a system-on-a-chip (SoC) for a mobile application will typically be configured for a particular I/O power supply voltage: either a high-voltage or a low-voltage power supply voltage depending upon the desired I/O standard.

It would be more efficient for an SoC manufacturer to provide a high-voltage/low-voltage output driver that can accommodate whatever standard (either high-voltage or low-voltage) that is chosen by a given customer. For example, a high-voltage output driver and a low-voltage driver could both be multiplexed to a given output terminal for an SoC. Depending upon what application is chosen by the user, the corresponding output driver would be active and selected for by the multiplexer to drive signals over the terminal to an external device. Although such a combination of output drivers may be suitable for lower-speed signaling, the multiplexing of the two output drivers onto a single output terminal loads the output terminal with a relatively high level of output capacitance. High-speed signaling over such a loaded terminal is then hindered by the excessive capacitive loading.

There is thus a need in the art for both a low-voltage data path and a high-voltage data path to interface a digital core to a hybrid output driver.

SUMMARY

A hybrid output driver is provided that includes: an output terminal; a first transistor coupled between the output terminal and an input/output (IO) power supply voltage node, wherein a gate of the first transistor is coupled to a first node for a high-voltage level-shifted version of a low-voltage data signal during a high-voltage data mode; a second transistor having a source coupled to ground and having a gate coupled to a second node for the low-voltage data signal during a low-voltage data mode; a third transistor coupled between the output terminal and a drain of the second transistor, wherein a gate of the third transistor is coupled to the first node during the high-voltage data mode; and a fourth transistor coupled between the output terminal and the IO power supply voltage node, wherein a gate of the fourth transistor is connected to the second node during the low-voltage data mode.

A method for a hybrid output driver is provided that includes: during a high-voltage data mode for the hybrid output driver: switching on a first transistor in response to a discharge of a high-voltage data signal to charge an output terminal to a high-power supply voltage; switching on a second transistor; and switching on a third transistor coupled to ground through the switched on second transistor to discharge the output terminal in response to a charging of the high-voltage data signal to the high-power supply voltage; during a low-voltage data mode for the hybrid output driver: switching on the third transistor; switching on the second transistor to discharge the output terminal to ground through the switched-on third transistor in response to a discharge of a low-voltage data signal; and switching on a fourth transistor to charge the output terminal to a low-power supply voltage in response to a charging of the low-voltage data signal to the low-power supply voltage, wherein the high-power supply voltage is greater than the low-power supply voltage.

A hybrid output driver and data path is provided that includes: a high-voltage data path including a first multiplexer configured to select for a level-shifted version of a low-voltage data signal during a high-voltage data mode and to select for a high-power supply voltage during a low-voltage data mode and including a second multiplexer configured to select for the level-shifted version of the low-voltage data signal during the high-voltage data mode and to select for the high-power supply voltage during the low-voltage data mode; a low-voltage data path including a third multiplexer configured to select for the low-voltage data signal during the low-voltage data mode and to select for the high-power supply voltage during the high-voltage data mode; an output terminal; a first p-type metal-oxide semiconductor (PMOS) transistor coupled between the output terminal and an I/O power supply node and having a gate coupled to an output of the first multiplexer a first n-type metal-oxide semiconductor (NMOS) transistor having a source coupled to ground and having a gate coupled to an output of the third multiplexer; a second NMOS transistor coupled between the output terminal and a drain of the first NMOS transistor and having a gate coupled to an output of the second multiplexer These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

A hybrid or combination high-voltage and low-voltage data path to a hybrid output driver is disclosed that accommodates signaling with both a relatively-high power supply voltage and a relatively-low power supply voltage. The hybrid output driver drives signals from a digital core such as in an application specific integrated circuit (ASIC) or an SoC to an external circuit. It will be assumed herein the external circuit is a low-power double data rate (LPDDR) dynamic random access memory (DRAM) but it will be appreciated that any external circuit that has a low-voltage data mode of operation and a high-voltage data mode of operation will benefit from the hybrid data path and hybrid output driver disclosed herein. The relatively-low power supply voltage is the power supply voltage for the digital core and for the LPDDR DRAM during a low-voltage data mode for the LPDDR DRAM. The relatively-high power supply voltage is the power supply voltage for the LPDDR DRAM during a high-voltage data mode for LPDDR DRAM. The digital core continues to use the relatively-low power supply voltage while the LPDDR DRAM operates in the high-voltage data mode.

Figure 1A:
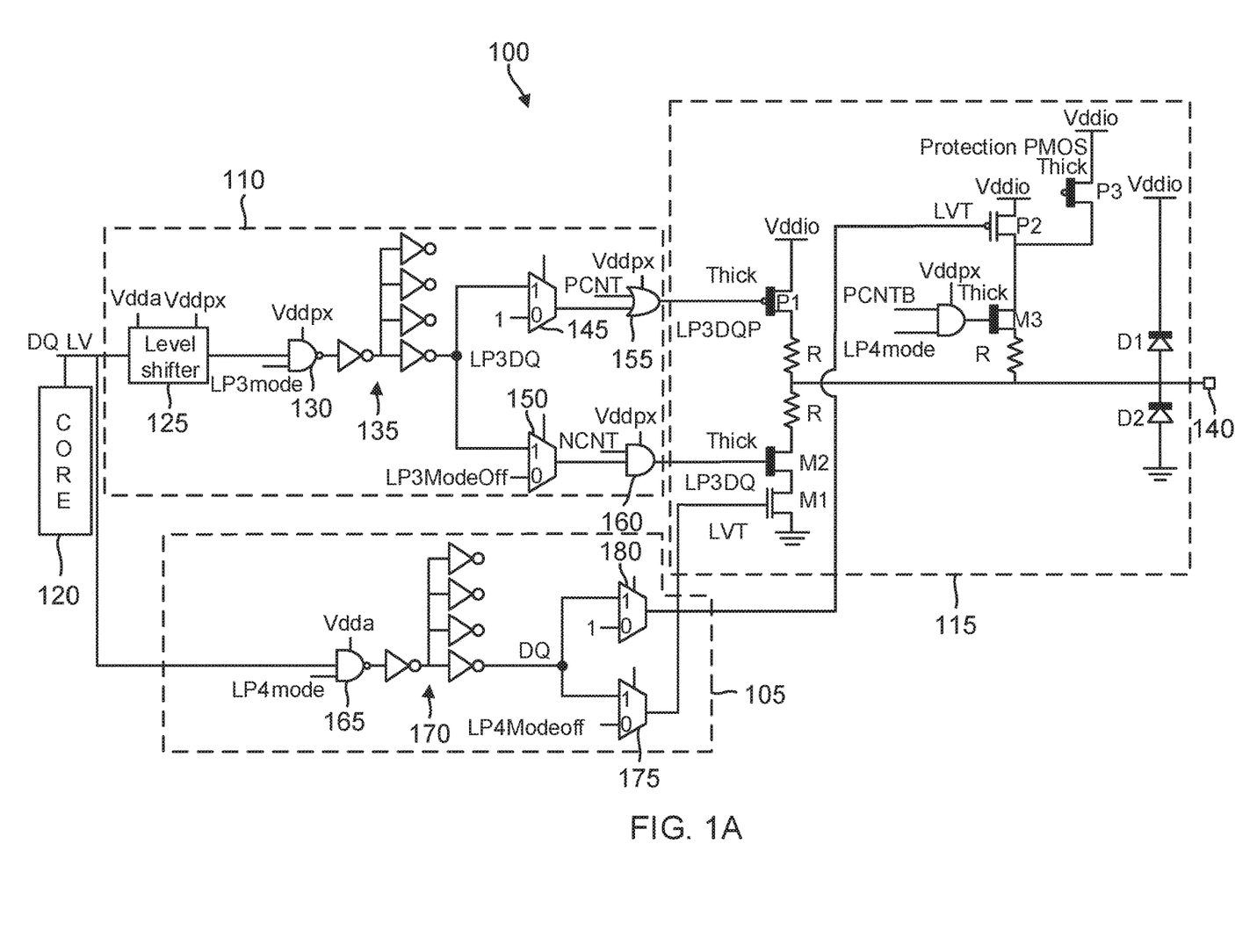
FIG. 1A illustrates an SoC with a hybrid output driver having tunable pull-up and pull-down impedances in accordance with an aspect of the disclosure.

An example low-voltage data path 105, a high-voltage data path 110, and a hybrid output driver 115 are shown in FIG. 1A for an SoC 100. In SoC 100, the high-voltage data mode of operation occurs according to the LPDDR3 memory standard whereas the low-voltage data mode of operation occurs according to the LPDDR4X memory standard but it will be appreciated that the high-voltage and low-voltage signaling disclosed herein is not limited to the LPDDR standards. Moreover, although the hybrid signaling architecture is shown for SoC 100, it will be appreciated that other types of integrated circuits would also benefit from this hybrid signaling architecture.

A digital core 120 for SoC 100 resides in a low-power voltage domain powered by a core power supply voltage Vdda that is compatible with thin-oxide transistors. There is thus no need to level shift a low-voltage input data signal DQLV from digital core 120 when driving low-voltage data path 105 as the circuits within low-voltage data path 105 are constructed with thin-oxide transistors. But the low-voltage input data signal DQLV is level-shifted in high-voltage data path 110 from the core power supply voltage VDDa to a relatively-high power supply voltage (Vddpx) of 1.2V that is used for the LPDDR3 signaling. Thin-oxide devices would be stressed by the relatively-high power supply voltage Vddpx. The circuits within high-voltage data path 110 are thus constructed with thick-oxide transistors as appropriate to protect them from being stressed from such a relatively-high power supply voltage.

Operation during the high-voltage data mode will be discussed first followed by a discussion of operation during the low-voltage data mode. These modes are applicable to any input/output protocol but the following examples will be directed to low-voltage and high-voltage signaling under the LPDDR protocol. In the LPDDR arts, an example of the high-voltage data mode is the LPDDR3 protocol (also designated herein as an LP3 mode of operation. Similarly, an example of the low-voltage data mode is the LPDDR4X protocol (also designated herein as an LP4X mode of operation). During the LP3 mode of operation, high-voltage data path 110 level-shifts the low-voltage input data signal DQLV from digital core 120 into a high-voltage input data signal that is inverted by a NAND gate 130 to form a high-voltage data signal LP3DQ in the Vddpx power supply voltage domain (e.g., 1.2V) using a level-shifter 125. The high-voltage data signal LP3DQ from high-voltage data path 110 drives the gate of both a thick-oxide pull-up PMOS transistor P1 and a thick-oxide pull-down NMOS transistor M2 in hybrid output driver 115. An input/output (I/O) power supply voltage Vddio for hybrid output driver 115 equals the Vddpx power supply voltage for the LP3 mode of operation. Conversely, I/O power supply voltage Vddio equals the Vdda power supply voltage for LP4X mode of operation.

In hybrid output driver 115, the source of pull-up transistor P1 connects to the I/O power supply node for the I/O power supply voltage Vddio whereas the drain of pull-up transistor P1 drain couples to a drain for pull-down transistor M2 through a pair of resistors R arranged in series. A node between the pair of resistors R is tied to an output terminal 140 (which is also designated herein as output pad 140) for SoC 100. Should the high-voltage data signal LP3DQ be a logical zero (ground), it will switch on pull-up transistor P1 to charge output pad 140 towards the I/O power supply voltage Vddio (which is Vddpx during the LP3 mode of operation). At the same time, pull-down transistor M2 would be switched off by the grounded data signal LP3DQ. Output pad 140 is thus charged to Vddpx during the LP3 mode of operation when high-voltage data signal LP3DQ is a logic zero. Conversely, the high-voltage data signal LP3DQ will switch on pull-down transistor M2 and switch off pull-up transistor P1 is when high-voltage data signal LP3DQ equals Vddpx during the LP3 mode of operation. The source of pull-down transistor M2 couples to ground through a thin-oxide NMOS transistor M1 that is maintained on during the high-voltage data mode as will be explained further herein. Output pad 140 will thus be discharged towards ground in response to the high-voltage data signal LP3DQ being charged to Vddpx. An external DRAM (not illustrated) configured for LPDDR3 operation would be coupled to output pad 140 to receive the resulting high-voltage data signals from output pad 140.

Figure 1B:
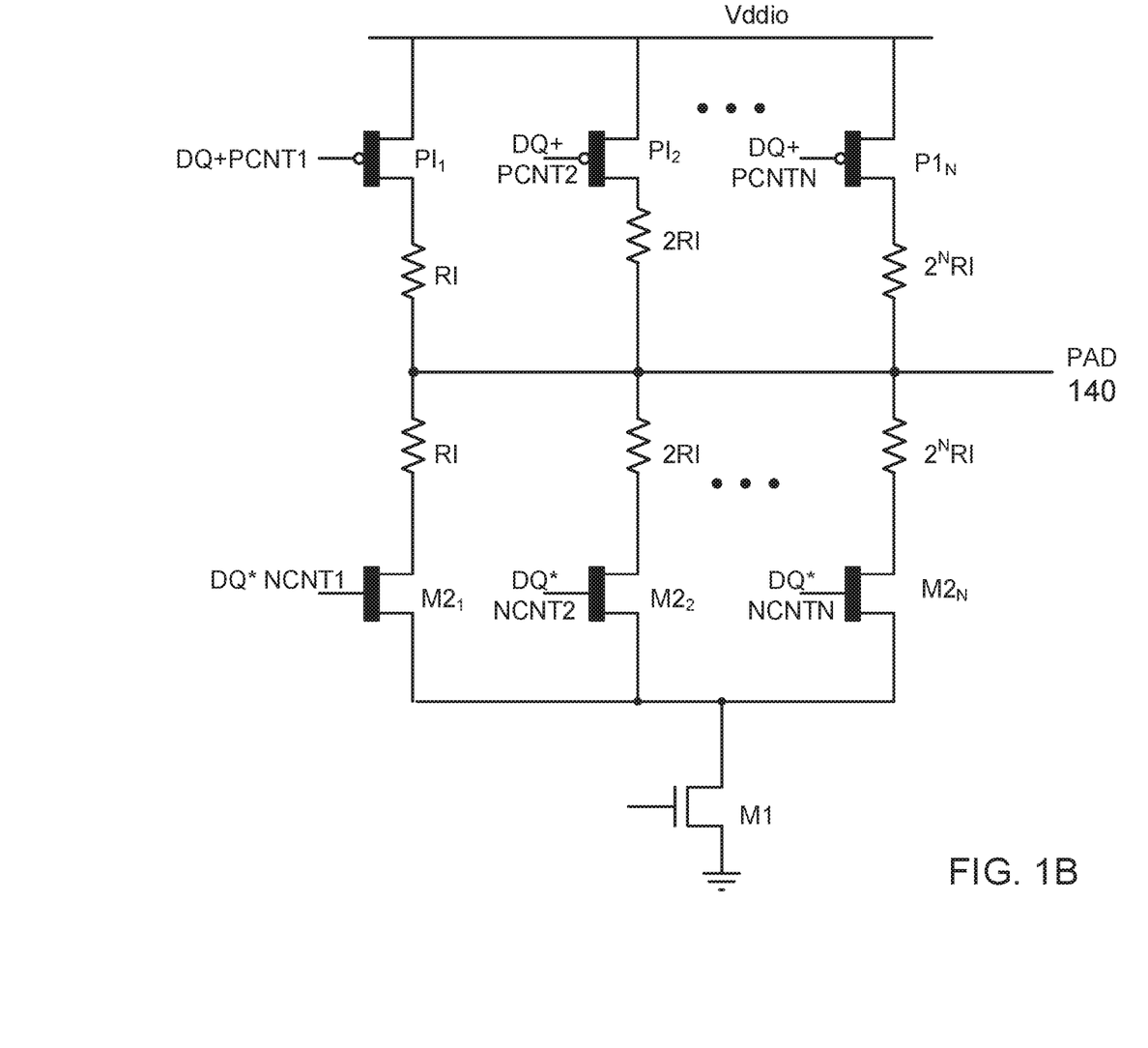
FIG. 1B illustrates the pull-up and pull-down tuning aspects of the hybrid output driver of FIG. 1A in more detail.

To provide a tunable pull-up impedance and pull-down impedance for the high-voltage data signals, pull-up transistor P1, pull-down transistor M2, and resistors R may each be instantiated in parallel as shown in FIG. 1B. Pull-up transistor P1 and pull-down transistor M2 are thus each shown as a single transistor in FIG. 1A for illustration clarity. As will be explained further herein, high-voltage data path 110 logically ORs the high-voltage data signal LP3DQ with a N-bit wide active-low pull-up tuning signal PCNT<1:N> in an OR gate 155. Depending upon the desired strength of the pull-up, various bits in the pull-up tuning signal PCNT<1:N> shut down the corresponding parallel instantiation of pull-up transistor P1. Pull-up transistor P1 is instantiated by N PMOS transistors arranged in parallel starting from a PMOS pull-up transistor $P1_1$ to a PMOS pull-up transistor $P1_N$. The gate of each these parallel-arranged pull-up transistors is driven by a corresponding bit from the ORed combination of high-voltage data signal LP3DQ and pull-up tuning signal PCNT<1:N> as produced by OR gate 155. Pull-up transistor $P1_1$ is thus driven by a signal DQ+PCNT1 which equals the logical OR of the pull-up tuning signal bit PCNT<1> and the high-voltage data signal LP3DQ. Similarly, a pull-up transistor $P1_2$ is driven by a signal DQ+PCNT2 which equals the logical OR of the pull-up tuning signal bit PCNT<2> and the high-voltage data signal LP3DQ. Finally, pull-up transistor $P1_N$ is driven by a signal DQ+PCNTN which equals the logical OR of pull-up tuning signal bit PCNT<N> and the high-voltage data LP3DQ. A low-voltage pull-up circuit (not illustrated) may also function to charge output terminal 140.

A source for each of pull-up transistor $P1_1$ through pull-up transistor $P1_N$ is connected to the I/O power supply node for the I/O power supply voltage Vddio as discussed with regard to FIG. 1A. The drain of pull-up transistor $P1_1$ connects to output pad 140 through a resistor R1 whereas the drain of pull-up transistor $P1_2$ connects to output pad 140 through a resistor 2R1 having twice the resistance of resistor R1. This binary progression of resistances continues for the remaining parallel-arranged pull-up transistors such that the drain of pull-up transistor $P1_N$ connects to output pad 140 through a resistor $2^N$R1 having a resistance that is $2^N$ times greater than the resistance of resistor R1. It will be appreciated that this binary progression of resistances may be varied in alternative implementations. Depending upon which bits of the pull-up tuning signal are asserted, the corresponding pull-up transistors and resistors will not contribute to the pull-up of output pad 140. In this fashion, the pull-up tuning signal PCNT<1:N> may be readily tuned to provide the desired pull-up impedance for output pad 140.

The pull-down impedance tuning is analogous in that pull-down transistor M2 is instantiated as N NMOS pull-down transistors arranged in parallel between output pad 140 and the drain of transistor M1 starting with a first pull-down transistor $M2_1$ and finishing with an Nth pull-down transistor $M2_N$. The drain of pull-down transistor $M2_1$ connects to output pad 140 through a resistor R1. Similarly, the drain of a second pull-down transistor $M2_2$ connects to output pad 140 through a resistor 2R1. This binary progression of resistances continues such that the drain of pull-down transistor $M2_N$ connects to output pad 140 through a resistor $2^N$R1. As discussed with the pull-up, this binary progression of resistances may be varied in alternative implementations. A source for each of pull-down transistors $M2_1$ through $M2_N$ connects to a drain of transistor M1.

High-voltage data path 110 logically $AND_S$ the high-voltage data signal LP3DQ with a N-bit wide active-high pull-down tuning signal NCNT<1:N> in an AND gate 160. Depending upon the desired strength of the pull-up, various bits in the pull-down tuning signal NCNT<1:N> shut down the corresponding parallel instantiation of pull-down transistor M2. The gate of each of the parallel-arranged pull-down transistors is driven by a corresponding bit from the ANDed combination of high-voltage data signal LP3DQ and pull-down tuning signal NCNT<1:N>. The gate of pull-down transistor $M2_1$ is thus driven by a signal DQ*NCNT1 which equals the logical AND of pull-down tuning signal bit NCNT<1> and the high-voltage data signal LP3DQ. Similarly, a gate of a pull-down transistor $M2_2$ is driven by a signal DQ*NCNT2 which equals the logical AND of pull-down signal tuning bit NCNT<2> and the high-voltage data signal $LP3DQ$. Finally, a gate of pull-down transistor $M2_N$ is driven by a signal DQ*NCNTN which equals the logical AND of pull-down tuing signal bit PCNT<N> and the high-voltage data LP3DQ. The pull-down impedance tuning for output pad 140 in hybrid output driver 115 is thus performed in an analogous fashion as discussed for the pull-up impedance tuning.

Referring again to FIG. 1A, NAND gate 130 in high-voltage data path 110 NANDs the output of level-shifter with an LP3 mode signal (LP3mode) to gate the output of level-shifter 125 if the LP3 mode of operation is not selected by a logical zero value for the LP3 mode signal. During the LP3 mode of operation, the LP3 mode signal is asserted to the Vddpx power supply voltage. NAND gate 130 thus inverts the output of level-shifter 125 during the LP3 mode of operation so that the level-shifted signal may be buffered in a buffer 135 to form the high-voltage data signal LP3DQ. An output of buffer 135 may thus be deemed form a first node for the high-voltage data signal LP3DQ. A multiplexer 145 selects for the high-voltage data signal LP3DQ from buffer 135 during the LP3 mode of operation to drive OR gate 155 that then ORs the high-voltage data signal LP3DQ with the pull-up tuning signal PCNT<1:N> to form the ORed data signals for the pull-up tuning discussed with regard to FIG. 1B. During the LP4X mode of operation, multiplexer 145 drives OR gate 155 with a logical one signal (the Vddpx power supply voltage) so that transistors $P1_1$ through $P1_N$ are switched off.

High-voltage data path 110 also includes a multiplexer 150 that selects for the high-voltage data signal LP3DQ from buffer 135 during the LP3 mode of operation to drive AND gate 160 that then ANDs the high-voltage data signal LP3DQ with the pull-down tuning signal NCNT<1:N> to form the ANDed data signals for the pull-down tuning as also discussed with regard to FIG. 1B. During the LP4X mode of operation, multiplexer 150 selects for an LP3 mode off signal (LP3modeoff) that equals the I/O power supply voltage Vddio while the LP4X mode is enabled. The pull-down tuning signal NCNT<1:N> thus controls which of pull-down transistors $M2_1$ through $M2_N$ are switched on during the LP4X mode of operation.

Note that the portion of high-voltage data path 110 subsequent to a first inverter in buffer 135 and prior to hybrid output driver 115 may be instantiated multiple times such that each instantiation may be selectively activated or de-activated to provide further tuning ability for the driving of output pad 140. Of these additional instantiations, only a second inverter in buffer 135 shown in FIG. 1A for illustration clarity.

The low-voltage data mode of operation (the LP4X mode of operation) will now be discussed. Low-voltage data path 105 includes a gating NAND gate 165 that gates the low-voltage data signal DQLV from digital core 120 during the LP3 mode but passes an inverted version of the low-voltage data signal DQLV to a buffer 170 during the LP4X mode. To perform this gating, NAND gate 165 NANDs the low-voltage data signal DQLV with an LP4 mode signal (LP4modeoff) that is asserted during the LP4X mode of operation and that is de-asserted during the LP3 mode of operation. Buffer 170 buffers the inverted version of the low-voltage data signal DQLV from NAND gate 165 to form a buffered low-voltage data signal DQ that is still within the core power supply voltage domain (Vdda) for digital core 120. An output of buffer 170 may be deemed to form a second node for the low-voltage data signal DQ. A multiplexer 175 selects for the low-voltage data signal DQ during the LP4X mode of operation so that the low-voltage data signal DQ drives the gate of transistor M1. Should the low-voltage data signal DQLV be a logic zero, the low-voltage data signal DQ will be high (the Vdda power supply voltage) so that transistor M1 switches on to discharge output pad 140 towards ground. The pull-down impedance is still controlled by transistors $M2_1$ through $M2_N$ as determined by the pull-down tuning signal as also occurs during the LP3 mode.

During the LP3 mode of operation, multiplexer 175 selects for an LP4 mode off signal (LP4mode) that equals the I/O power supply voltage Vddio while the LP3 mode is enabled. Transistor M1 is thus switched on while the LP3 mode is enabled.

Low-voltage data path 105 also includes a multiplexer 180 that selects for the low-voltage data signal DQ to drive a gate of a thin-oxide PMOS pull-up transistor P2 having its source tied to the I/O power supply node for the Vddio power supply voltage node. The drain of pull-up transistor P2 couples to output pad 140 through a thick-oxide pull-up tuning NMOS transistor M3. Transistor M3 and a resistor R may be instantiated in parallel analogously as discussed with regard to FIG. 1B. It will be appreciated that resistor R may be deleted in alternative implementations. An n-bit wide complement of the pull-up tuning signal (PCNTB) drives the gates of the parallel-arranged pull-up transistors M3 as coupled through an AND gate 185 that ANDs the complement pull-up tuning signal PCNTB with an LP4X mode signal that is asserted during the LP4X mode of operation. The pull-up from pull-up transistor P2 is thus tuned through the parallel combination of pull-up transistors M3 and corresponding resistors during the LP4X mode of operation (these transistors and resistors are represented by single pull-up transistor M3 and resistor R in FIG. 1A for illustration clarity). During the LP3 mode of operation, the LP4X mode signal is a logical zero such that all the bits of the N-bit wide complement pull-up tuning signal PCNTB are zeroes. All the pull-up transistors M3 are then switched off. Similarly, multiplexer 180 in low-voltage data path 105 selects for a logical one signal during the LP3 mode of operation to switch off pull-up transistor P2. To protect the thin oxide of pull-up transistor P2 during the LP3 mode of operation, a thick-oxide transistor P3 is switched on. The gate signal for thick-oxide transistor P3 is not shown in FIG. 1A for illustration clarity but this gate signal may be implemented using a complement of the LP4 mode signal. The source of thick-oxide transistor P3 is tied to the Vddio power supply voltage node whereas its drain is tied to the drain of pull-up transistor P2. The drain and source of pull-up transistor P2 are thus both charged to Vddpx during the LP3 mode of operation to protect pull-up transistor P2. A pair of diodes D1 and D2 coupled to the output pad 140 provide electrostatic discharge protection.

Figure 1C:
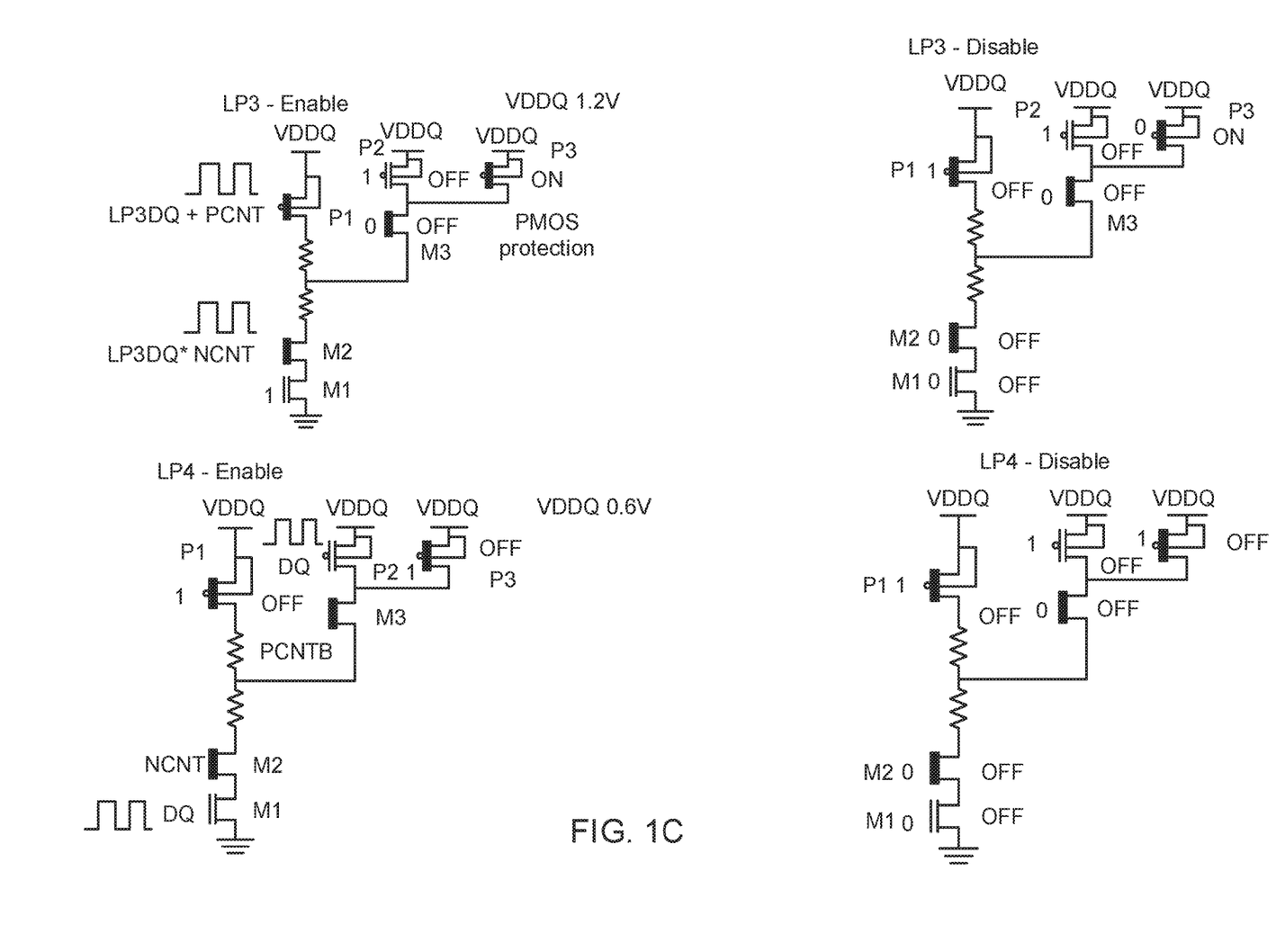
FIG. 1C shows some simplified views of the hybrid output driver of FIG. 1A during the high-voltage and low-voltage modes of operation.

Operation of hybrid output driver 115 may be better appreciated through the simplified views shown in FIG. 1C. During an LP3 mode of operation (LP3-enable), the logical OR of the high-voltage data signal LP3DQ and the pull-up tuning signal PCNT drives the gate of pull-up transistor P1. Similarly, the logical AND of the high-voltage data signal LP3DQ and the pull-down tuning signal NCNT drives the gate of pull-down transistor M2. Transistor M1 is on. Pull-up transistors P2 and M3 are off. Transistor P3 is on to protect pull-up transistor P2. Should an instantiation of hybrid output driver 115 be disabled during the LP3 mode of operation (LP3-Disable), transistors M1, M2, M3, P1, and P2 are all off but transistor P3 remains on for protection of transistor P2.

During an LP4X mode of operation (LP4X-Enable), pull-up transistor P1 and transistor P3 are both off. The buffered data signal DQ from low-voltage data path 105 drives the gates of transistor M1 and pull-up transistor P2. The pull-down tuning signal NCNT drives the gate of pull-down transistor M2 whereas the complement pull-up signal PCNTB drives the gate of transistor M3. Should an instantiation of hybrid output driver 115 be disabled during the LP4X mode of operation (LP4X-Disable), transistors M1, M2, M3, P1, P2, and P3 are all off.

Figure 2:
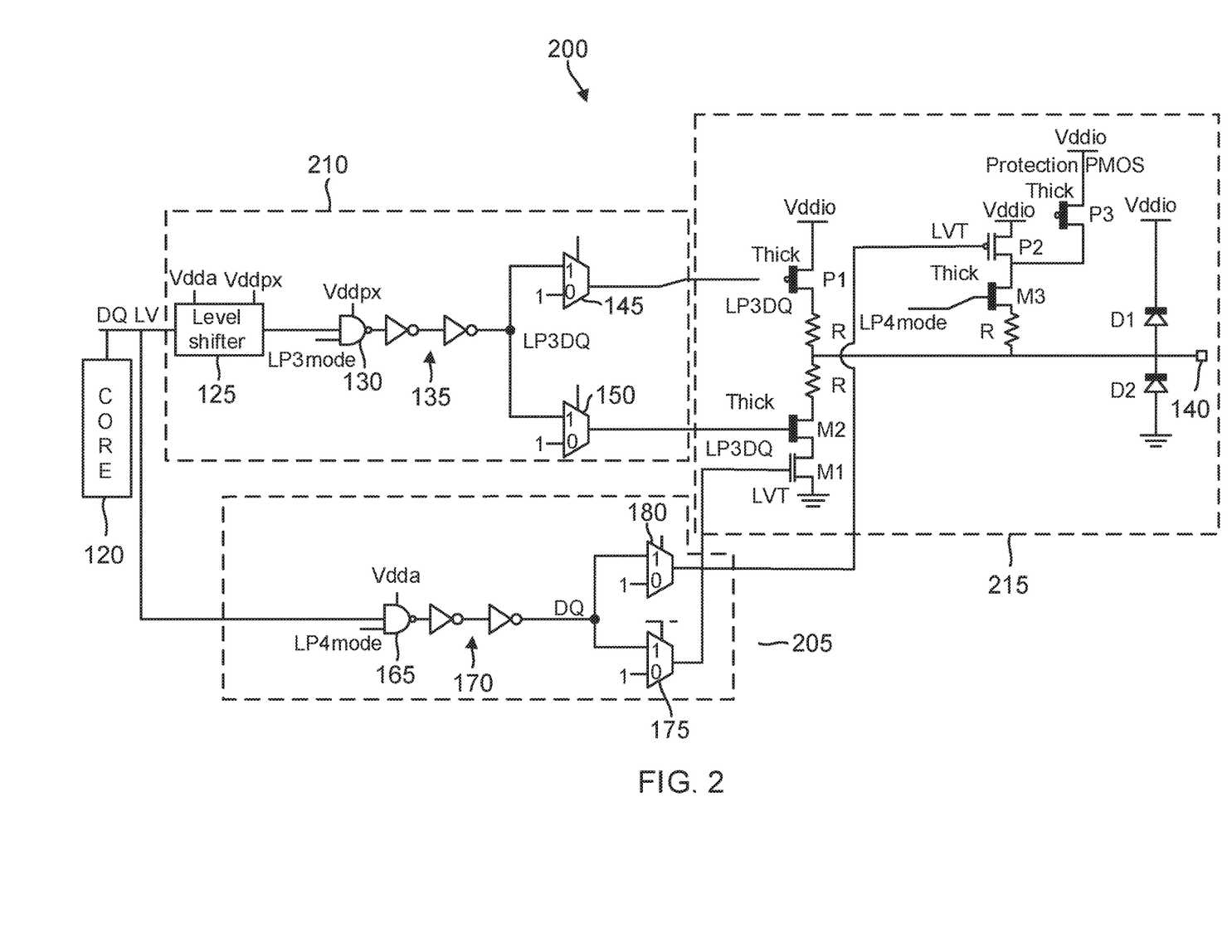
FIG. 2 illustrates an SoC with a hybrid output driver in which the pull-up and pull-down impedances are fixed in accordance with an aspect of the disclosure.

The hybrid architecture disclosed herein may be simplified as shown in FIG. 2 for an SoC 200 in which the pull-up and pull-down impedances are fixed rather than tunable. SoC 200 includes a low-voltage data path 205, a high-voltage data path 210, and a hybrid output driver 215 arranged analogously as discussed with regard to SoC 100. However, there is just a single pull-up transistor P1 and corresponding resistor R in hybrid output driver 215. There is thus no pull-up or pull-down tuning so that high-voltage data path 210 does not include corresponding NOR gate 155 and AND gate 160. High-voltage data path 210 thus includes only level-shifter 125, NAND gate 130, buffer 135, and multiplexers 145 and 150 arranged as discussed for high-voltage data path 110. Pull-up transistor P1 in hybrid output driver 215 has its gate driven by the output of multiplexer 145 from high-voltage data path 210. The pull-up impedance for hybrid output driver 215 during the LP3 mode of operation is thus controlled by the resistance for resistor R. Similarly, the output of multiplexer 150 in high-voltage data path 210 drives the gate of a single pull-down transistor M2 having a drain coupled to output pad 140 through another resistor R so that the pull-down impedance for hybrid output driver 215 during the LP3 mode of operation is also controlled by the resistance for resistor R. Low-voltage data path 205 includes NAND gate 165, buffer 170, and multiplexers 180 and 175 arranged as discussed for low-voltage data path 105.

In hybrid output driver 215, pull-down transistor M2 controls the pull-down impedance during the LP4X mode of operation. During pull-up for the LP4X mode of operation, the LP4X mode signal is asserted to switch on pull-up transistor M3 (which is not instantiated in parallel). The pull-up impedance during the LP4X mode of operation is thus controlled by the resistance of the resistor R tied to the source of transistor M3. For illustration clarity, the LP3 mode off signal that is selected by multiplexer 150 during the LP4X mode of operation is shown as a binary one in FIG. 2 since that is the value of the LP3 mode off signal when the LP4X mode is enabled. Similarly, the LP4 mode off signal that is selected by multiplexer 175 during the LP3 mode of operation is shown as a binary one signal in FIG. 2 for illustration clarity since that is the value of the LP4 mode off signal when the LP3 mode is enabled.

Figure 3:
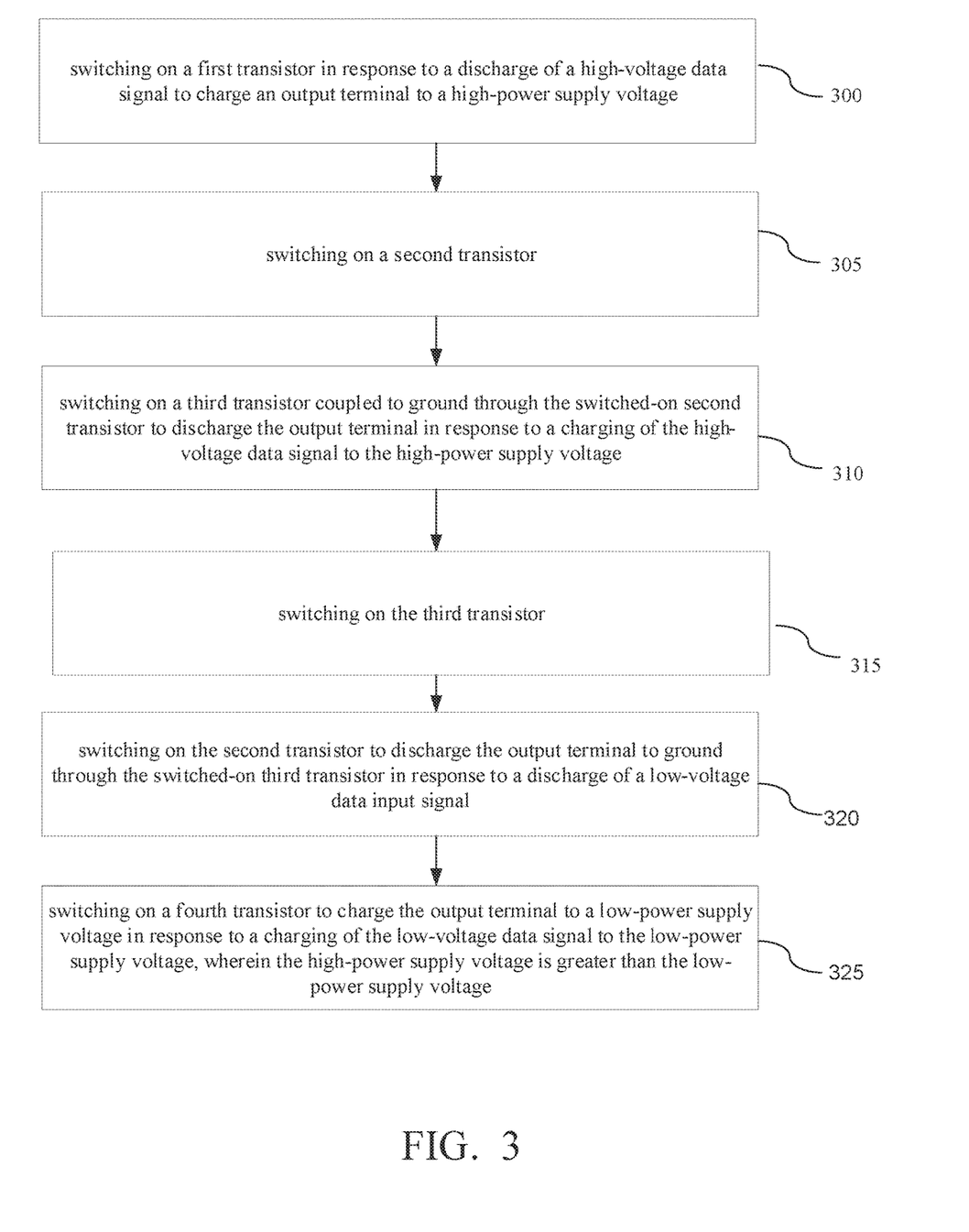
FIG. 3 is a flowchart for a method of operation for a hybrid output driver in accordance with an aspect of the disclosure.

A method of operation for a hybrid output driver will now be discussed with regard to the flowchart of FIG. 3. The method includes a first set of acts 300, 305, and 310 that occur during the high-voltage data mode for the hybrid output driver. Act 300 includes switching on a first transistor in response to a discharge of a high-voltage data signal to charge an output terminal to a high-power supply voltage. An example of act 300 is the switching on of pull-up transistor P1. Act 305 is the switching on a second transistor. The switching on of transistor M during the high-voltage data mode is example of act 305. Act 310 is the switching on a third transistor coupled to ground through the switched on second transistor to discharge the output terminal in response to a charging of the high-voltage data signal to the high-power supply voltage. An example of act 310 is the switching on of pull-down transistor M2.

The method also includes a set of acts 315, 320, and 325 that occur during the low-voltage data mode for the hybrid output driver. Act 315 includes switching on the third transistor. The switching on of pull-down transistor M2 during the low-voltage data mode is an example of act 315. Act 320 is the switching on the second transistor to discharge the output terminal to ground through the switched-on third transistor in response to a discharge of a low-voltage data signal. The switching on of transistor M1 in response to a discharge of the low-voltage data signal DQLV is an example of act 320. Finally, act 325 is the switching on a fourth transistor to charge the output terminal to a low-power supply voltage in response to a charging of the low-voltage data signal to the low-power supply voltage, wherein the high-power supply voltage is greater than the low-power supply voltage. The switching on of pull-up transistor P2 in response to a binary one state for the low-voltage data signal DQLV is an example of act 325.

Figure 4:
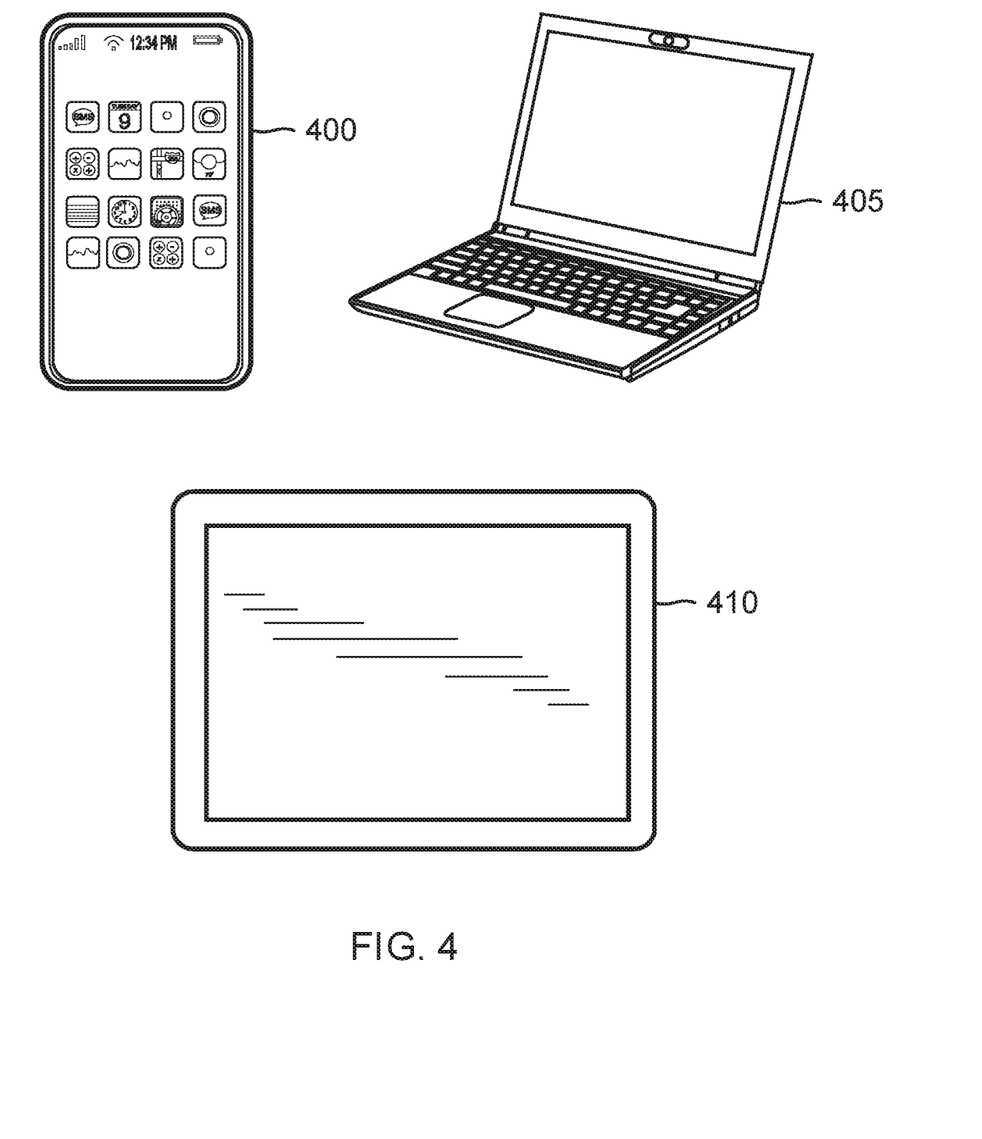
FIG. 4 illustrates some example electronic systems each incorporating a hybrid output driver in accordance with an aspect of the disclosure.

A hybrid output driver as disclosed herein may be advantageously incorporated in any suitable mobile device or electronic system. For example, as shown in FIG. 4, a cellular telephone 400, a laptop computer 405, and a tablet PC 410 may all include a hybrid output driver in accordance with the disclosure. Other exemplary electronic systems such as a music player, a video player, a communication device, and a personal computer may also be configured with hybrid output drivers constructed in accordance with the disclosure.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A hybrid output driver, comprising:
   an output terminal;
   a first transistor coupled between the output terminal and an input/output (IO) power supply voltage node, wherein a gate of the first transistor is coupled to a first node for a high-voltage level-shifted version of a low-voltage data signal during a high-voltage data mode;
   a second transistor having a source coupled to ground and having a gate coupled to a second node for the low-voltage data signal during a low-voltage data mode;
   a third transistor coupled between the output terminal and a drain of the second transistor, wherein a gate of the third transistor is coupled to the first node during the high-voltage data mode; and
   a fourth transistor coupled between the output terminal and the IO power supply voltage node, wherein a gate of the fourth transistor is coupled to the second node during the low-voltage data mode.

2. The hybrid output driver of claim 1, wherein the first transistor is a thick-oxide p-type metal-oxide semiconductor (PMOS) transistor, the third transistor is a thick-oxide n-type metal-oxide semiconductor (NMOS) transistor, the second transistor is a thin-oxide NMOS transistor, and the fourth transistor is a thin-oxide PMOS transistor.

3. The hybrid output driver of claim 1, wherein the I/O power supply voltage node is configured to be charged to a high-power supply voltage during the high-voltage data mode and to be charged to a low-power supply voltage during the low-voltage data mode, and wherein the high-power supply voltage is greater than the low-power supply voltage.

4. The hybrid output driver of claim 3, wherein the high-power supply voltage is a power supply voltage for a low power double data rate 3 (LPDDR3) dynamic random access memory (DRAM), and wherein the low-power supply voltage is a power supply voltage for a low power double data rate 4 (LPDDR4) DRAM.

5. The hybrid output driver of claim 3, further comprising:
   a fifth transistor coupled between the output terminal and a drain of the fourth transistor, wherein the fifth transistor is configured to be switched on during the low-voltage data mode and to be switched off during the high-voltage data mode.

6. The hybrid output driver of claim 5, further comprising:
   a sixth transistor having a source connected to the I/O power supply voltage node and having a drain connected to a drain of the fourth transistor, and wherein the sixth transistor is configured to be on during the high-voltage data mode and to be off during the low-voltage data mode.

7. The hybrid output driver of claim 6, wherein the fifth transistor is a thick-oxide NMOS transistor and the sixth transistor is a thick-oxide PMOS transistor.

8. The hybrid output driver of claim 1, further comprising:
   a pull-up resistor coupled between the output terminal and a drain of the first transistor;
   a pull-down resistor coupled between the output terminal and a drain of the third transistor.

9. The hybrid output driver of claim 8, wherein the first transistor comprises a plurality of first transistors arranged in parallel, and wherein the pull-up resistor comprises a plurality of pull-up resistors corresponding to the plurality of first transistors.

10. The hybrid output driver of claim 8, wherein the third transistor comprises a plurality of third transistors arranged in parallel, and wherein the pull-down resistor comprises a plurality of pull-down resistors corresponding the plurality of third transistors.

11. The hybrid output driver of claim 1, wherein the output terminal is an output terminal for driving a dynamic random access memory.

12. The hybrid output driver of claim 1, wherein the low-voltage data signal is an inverted version of a low-voltage input data signal from a digital core.

13. The hybrid output driver of claim 12, wherein the digital core is a digital core for a system-on-a-chip.

14. The hybrid output driver of claim 1, wherein the hybrid output driver is incorporated into a mobile device.

15. The hybrid output driver of claim 14, wherein the mobile device is a cellular telephone.

16. A method for a hybrid output driver, comprising:
   during a high-voltage data mode for the hybrid output driver:
      switching on a first transistor in response to a discharge of a high-voltage data signal to charge an output terminal to a high-power supply voltage;
      switching on a second transistor; and
      switching on a third transistor coupled to ground through the switched-on second transistor to discharge the output terminal in response to a charging of the high-voltage data signal to the high-power supply voltage:
   during a low-voltage data mode for the hybrid output driver:
      switching on the third transistor;
      switching on the second transistor to discharge the output terminal to ground through the switched-on third transistor in response to a discharge of a low-voltage data signal; and switching on a fourth transistor to charge the output terminal to a low-power supply voltage in response to a charging of the low-voltage data signal to the low-power supply voltage, wherein the high-power supply voltage is greater than the low-power supply voltage.

17. The method of claim 16, further comprising:
tuning an impedance for the output terminal during high-voltage data mode and during the low-voltage data mode.

18. A hybrid output driver, comprising:
a high-voltage data path including a first multiplexer configured to select for a level-shifted version of a low-voltage data signal during a high-voltage data mode and to select for a high-power supply voltage during a low-voltage data mode and including a second multiplexer configured to select for the level-shifted version of the low-voltage data signal during the high-voltage data mode and to select for the high-power supply voltage during the low-voltage data mode;
a low-voltage data path including a third multiplexer configured to select for the low-voltage data signal during the low-voltage data mode and to select for the high-power supply voltage during the high-voltage data mode;
an output terminal;
a first PMOS transistor coupled between the output terminal and an I/O power supply voltage node and having a gate coupled to an output of the first multiplexer;
a first NMOS transistor having a source coupled to ground and having a gate coupled to an output of the third multiplexer;
a second NMOS transistor coupled between the output terminal and a drain of the first NMOS transistor and having a gate coupled to an output of the second multiplexer.

19. The hybrid output driver of claim 18, wherein the high-voltage data path includes a level-shifter for level-shifting the low-voltage data signal into the level-shifted version of the low-voltage data signal.

20. The hybrid output driver of claim 18, wherein the low-voltage data path includes a fourth multiplexer configured to select between the low-voltage data signal during the low-voltage data mode and to select for the high-power supply voltage during the high-voltage mode, the hybrid output driver further comprising:
a second PMOS transistor coupled between the output terminal and the I/O power supply voltage node and having a gate connected to an output of the fourth multiplexer.

21. The hybrid output driver of claim 20, wherein the I/O power supply voltage node is configured to be charged to the high-power supply voltage during the high-voltage data mode and to be charged to a low-power supply voltage during the low-voltage data mode, and wherein the high-power supply voltage is greater than the low-power supply voltage.

22. The hybrid output driver of claim 20, wherein the first PMOS transistor and the second NMOS transistor are both thick-oxide transistors, and wherein the first NMOS transistor and the second PMOS transistor are both thin-oxide transistors.

* * * * *